United States Patent [19]

Tserng

[11] Patent Number: 5,532,506
[45] Date of Patent: Jul. 2, 1996

[54] INTEGRATED CIRCUIT ADAPTED FOR IMPROVED THERMAL IMPEDANCE

[75] Inventor: Hua Q. Tserng, Dallas, Tex.

[73] Assignee: Texas Instruments Incorporated, Dallas, Tex.

[21] Appl. No.: 339,429

[22] Filed: Nov. 14, 1994

Related U.S. Application Data

[63] Continuation-in-part of Ser. No. 298,822, Aug. 31, 1994.

[51] Int. Cl.$^6$ .................... H01L 23/52; H01L 23/535; H01Q 1/40
[52] U.S. Cl. .................. 257/276; 257/728; 257/776; 343/873
[58] Field of Search .................. 257/275–278, 257/728, 776, 760, 759, 712, 713, 717; 333/33, 247, 161, 164; 343/700 R, 700 MS, 873

[56] References Cited

U.S. PATENT DOCUMENTS 5,202,752  4/1993  Honjo ........................ 257/478
5,319,237  6/1994  Legros ....................... 257/522
5,373,185  12/1994  Sato ......................... 257/587

OTHER PUBLICATIONS

W. S. Wong, W. D. Gray, and D. C. Wang, "Flip Chip Manufacturing Technology for GaAs MMIC," Hughes Aircraft Company, Microelectronic Circuits Division, 1993 GaAs Mantech, Conf.

Primary Examiner—Peter Toby Brown
Attorney, Agent, or Firm—Michael K. Skrehot; James C. Kesterson; Richard L. Donaldson

[57] ABSTRACT

A flip-chip integrated circuit 1100 having a transistor 1108 formed at a frontside surface of a substrate 1104. An airbridge 1106 may be formed over portions of the transistor wherein a top surface of the airbridge is spaced from the frontside surface by a distance approximately equal to, or greater than, the thickness of the substrate. The circuit may also include a transmission line 1114 at the frontside surface and a heatsink 1102 coupled to the airbridge.

13 Claims, 5 Drawing Sheets

INTEGRATED CIRCUIT ADAPTED FOR IMPROVED THERMAL IMPEDANCE

RELATED APPLICATIONS

This is a continuation-in-part of copending U.S. application Ser. No. 08/298,822 filed Aug. 31, 1994 by Hua-Quen Tserng and Paul Saunier for an invention entitled "Integrated Circuit with Improved Thermal Impedance." This application includes subject matter which is related to U.S. patent application Ser. No. 08/159,648, "Low Thermal Impedance Integrated Circuit," (Texas Instruments, Inc., Docket No. TI-18439), filed Nov. 30, 1993.

FIELD OF THE INVENTION

This invention generally relates to semiconductor integrated circuits, and more specifically to high density structures and methods of fabrication.

BACKGROUND OF THE INVENTION

The continual demand for high performance integrated circuits in smaller chip areas has resulted in downsizing transistor dimensions and increasing operating power densities. This leads to heat dissipation problems, especially for GaAs-based circuits since GaAs has only one-third the thermal conductivity of silicon. One solution to the thermal problem is a flip-chip approach where the substrate on which the circuit is fabricated is "flipped," and the circuit side is bonded directly to a heatsink/groundplane. This removes the problem of having the substrate, with its poor thermal conductivity, between the circuit and the heatsink.

Flip-chip bonding for integrated circuits allows for a higher density of interconnection with less parasitic impedances than with traditional wire bonding and tape automated bonding. In flip-chip bonding, solder bumps on the bonding pads on the frontside of a die are aligned with solder-wettable metallization on a carrier substrate, and a solder reflow forms all of the solder bonds simultaneously. In contrast to wire bonding, the flip-chip bond pads may be located anywhere on the frontside of a die and thus simplify integrated circuit layout.

One problem with the traditional flip-chip approach is that the only circuitry on the down-side of the wafer is in the form of active devices, e.g. transistors. Transmission lines, resistors, capacitors, bond pads and so forth are placed on the up-side of the wafer. Access between the active devices on the down-side and the passive circuitry on the up-side is provided through vias running through the thickness of the wafer. The requirement of having processing on both sides of the wafer increases wafer handling and results in a complex fabrication process.

Figure 1:
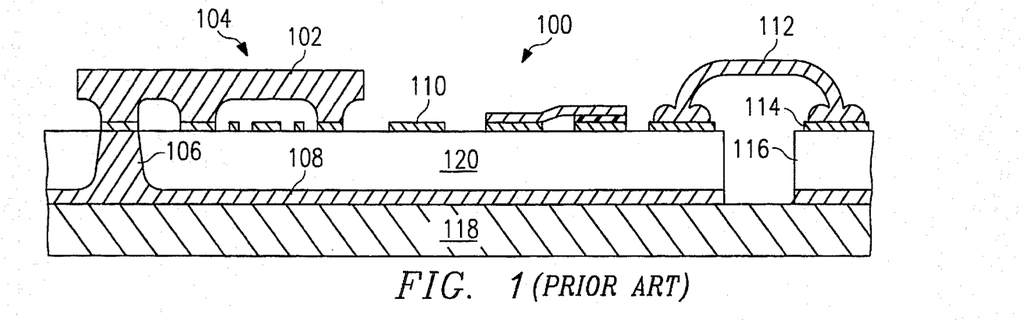
FIG. 1 is a cross-sectional view of a prior art monolithic microwave integrated circuit.

FIG. 1 shows a typical prior art monolithic microwave integrated circuit (MMIC) 100 and shows an air bridge 102 connecting two source regions of MESFET 104 through a via 106 to ground plane 108. The circuit also includes microstrip transmission lines 110 for matching and input/output circuits. Wire bonding 112 connects to pad 114 on alumina substrate 116 which may in turn connect to a coaxial cable. The ground plane 108 typically abuts a heat sink 118, and the GaAs substrate or die 120 is typically about 100 μm thick. It may be appreciated that the low thermal conductivity of the GaAs die 120 results in a high thermal impedance for devices in this configuration.

Figure 2:
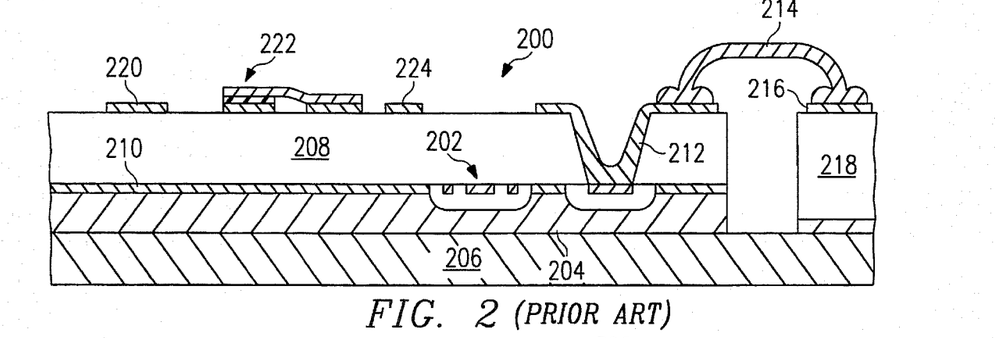
FIG. 2 is a cross-sectional view of a prior art flip-chip device.

FIG. 2 shows a prior art flip-chip approach to the problem of high thermal impedance devices. Flip-chip MMIC 200 includes a MESFET 202 with airbridge 204 in direct contact with heatsink 206. MESFET 202 is fabricated on GaAs die 208. Groundplane 210 is deposited onto the surface of the wafer and airbridge plating is deposited to form a substantially planar surface with which to contact heatsink 206. The input and output to the MESFET 202 (or other active device) is taken through the die 208 by a via 212 to the top side of the die where signals are transferred off the die by wire bond 214 to a pad 216 on an alumina substrate 218, as in FIG. 1. Transmission lines 220, capacitors 222, and resistors 224 are formed on the top side of the die 208. This configuration has the disadvantage that processing is required on both sides of the semiconductor die 208. The increased wafer handling and process steps involved in this approach present a severe cost disadvantage.

SUMMARY OF THE INVENTION

The present invention provides integrated circuits having active devices in contact with a heatsink for superior thermal impedance performance, and also have matching circuitry and passive components on the same surface at which the active devices are formed. This allows for virtually all process steps to be accomplished on a single side of the substrate. Some embodiments of the invention provide an advantage in that the thickness of the substrate or die is not critical to the performance of the integrated circuit. In some embodiments a conventional microwave integrated circuit is adapted for use in the "flip-chip" configuration.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Flip-chip with matching circuitry

Figure 3A:
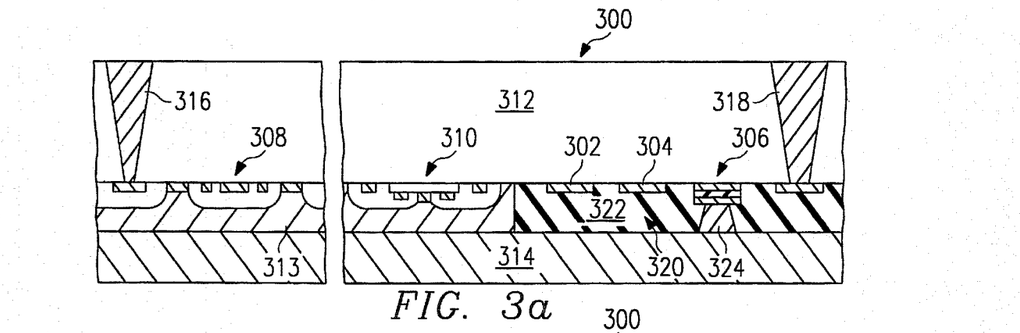
FIG. 3a is a cross-sectional view of an integrated circuit with matching circuitry and transmission lines and active devices on a single surface of a flip-chip device in accordance with a first preferred embodiment of the invention.

FIG. 3a shows a first embodiment MMIC 300 in which matching circuitry including transmission lines 302, resistors 304, capacitors 306 and other components are formed on the surface of a GaAs die in which the active devices such as MESFETs 308 and HBTs 310 are formed. This presents the advantage of having virtually all of the processing accomplished on a single side of the die 312, while retaining the thermal impedance advantages of the flip-chip approach. As in the flip-chip configurations described hereinabove, the airbridges 313 linking for example the source pads of MESFET 308 or the emitter pads of HBT 310 form the thermal link with heatsink 314. The input and output to the circuit may be taken by vias 318 to the top side of the die in the standard manner.

Figure 3B:
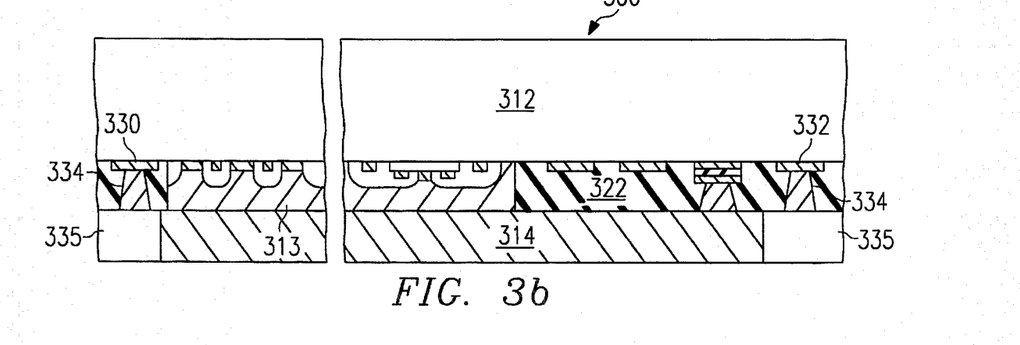
FIGS. 3b–3d are views of an alternative input/output signal routing scheme for the circuit substantially as shown in FIG. 3a and in accordance with a first preferred embodiment of the invention.
Figure 3C:
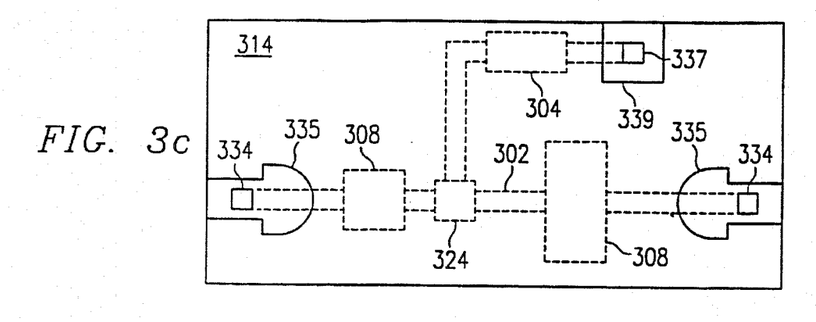
Figures 3D, 3F:
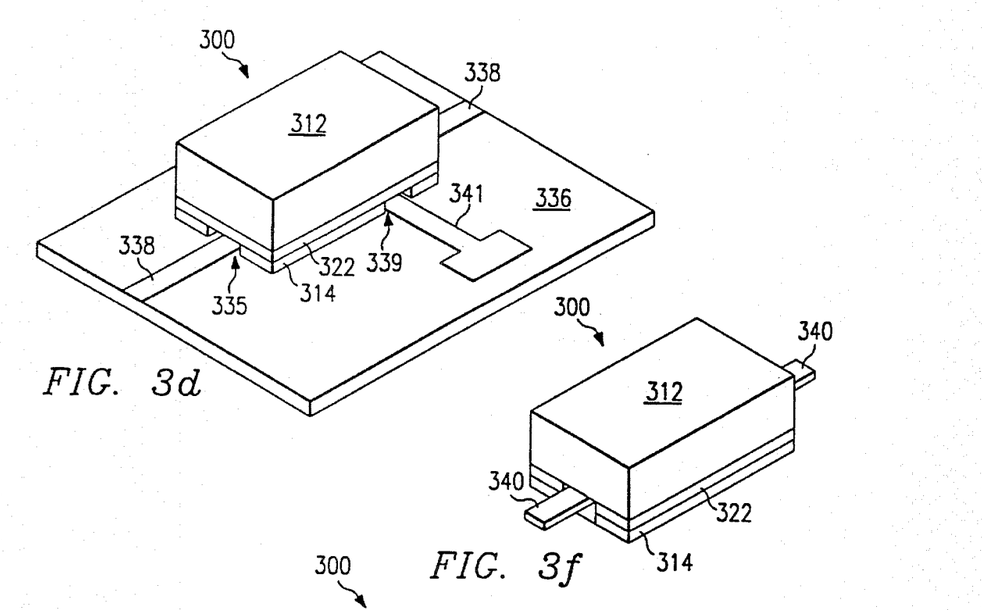
FIGS. 3e and 3f are views of another alternative input/output signal routing scheme for the circuit substantially as shown in FIG. 3a and in accordance with a first preferred embodiment of the invention.

An alternative method of routing the input and output signals is shown in FIG. 3b. The circuit is similar to that of FIG. 3a except that input 330 and output pads 332 are connected by vias 334 to the planarized surface corresponding to the top of airbridge 313 and dielectric 322. FIG. 3c is a sketch of a view from the bottom of the structure. A window 335 is etched in heatsink/groundplane 314. The structure 300 may be mounted on a substrate 336 patterned with pads and transmission lines 338 as shown in FIG. 3d. Pads 334 can be attached to pads and transmission lines 338 by solder bumps for example. This eliminates the backside processing used to form vias 316 and 318 in FIG. 3a. FIG. 3c also represents a typical layout of an amplifier circuit (the lines and components are shown dashed as they lie beneath groundplane 314 and dielectric 322). Transistors 308, capacitors 324, transmission lines 302, and resistors 304 are shown in a typical amplifier layout. Bias pad 337 is accessible through window 339 in groundplane 314. Bias pad 337 may be connected by a solder bump for example to bias lead 341 in a manner similar to that used fix input and output pads 334.

Figure 3E:
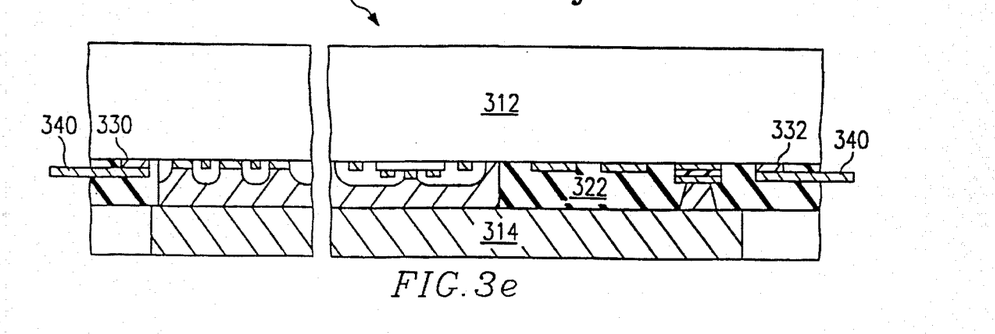

Another method of routing the input and output signals from circuit 300 is shown in FIG. 3e. Beam leads 340 are bonded or soldered to pads 330 and 332. A perspective view of the structure 300 is shown in FIG. 3f. This configuration allows the circuit 300 to be utilized as a discrete component in that beam leads 340 may be bonded to pads on printed circuit boards or on alumina substrates, tier example. This approach is advantageous in that the entire structure 300 can be inexpensively hermetically sealed with a passivating packaging material in much the same way as beam-lead diodes, tier example.

A feature of this embodiment is that the surface of the die that is mounted directly to the heatsink 314 is substantially planar as in the configuration shown in FIG. 2. However, instead of a planarized surface of plated metal, the structure of FIG. 3a, 3b, or 3e includes plated airbridges 313 as well as matching circuitry 320 planarized by a low-permittivity, low-loss dielectric layer 322 such as polyimide. Shunt components, such as capacitor 306 are easily grounded by etching a via through polyimide 322 prior to flipping and mounting the die on heatsink 314. The preferred thickness of the polyimide, and the plated airbridges, is between approximately 10 and 20 µm. Heatsink 314 is a high-thermal-conductivity dielectric material such as AlN or BeO, or a gold-plated metal such as copper. The dielectric heatsinks can be patterned with evaporated or plated metal to form input/output and bias lines and pads to which the plated features such as via 324 may be connected.

Figure 9A:
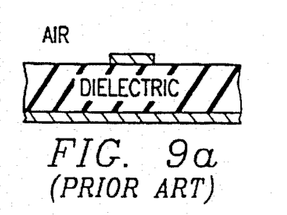
FIGS. 9a–c are cross-sectional views of various transmission line configurations.
Figure 9B:
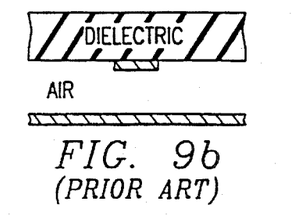

It may be appreciated that the transmission lines 302 may not be of the traditional "microstrip" type as shown in FIG. 9a where a lead on top of the substrate in conjunction with the groundplane on the opposite surface of the substrate work to form a transmission medium. In the circuit of FIG. 3a the transmission line 302 is more in the form of "inverted microstrip", as shown in FIG. 9b, because the high-permittivity die 312 lies above the line 302, rather than between the line 302 and the groundplane 314. A true inverted microstrip configuration would have air between the line 302 and the groundplane 314. In the circuit of FIG. 3a, for example, the line and groundplane are separated by the low-permittivity, low-loss dielectric, polyimide, but the design approach is very similar to that of circuits using true inverted microstrip. As in microstrip, the characteristic impedance of a line is dependent on the ratio of the width of the line 302 to the line's height above the groundplane 314. For polyimide with a dielectric constant of 3.3, the width to height ratio for a 50-ohm line is approximately unity. For the commonly used range of 50 to 80 ohms the ratio is between approximately 0.7 and unity. Inverted microstrip has an advantage over standard microstrip in that for a given characteristic impedance, the line 302 will be wider. This both reduces line loss and relaxes fabrication tolerances. An additional advantage is that the thickness of the die 312 is not critical in determining the impedance of line 302. Thus, the die can be left much thicker, e.g. 625 µm, instead of the 100 or 150 µm typically required for die thicknesses when using microstrip transmission line.

Conventional Integrated Circuits

Figure 11:
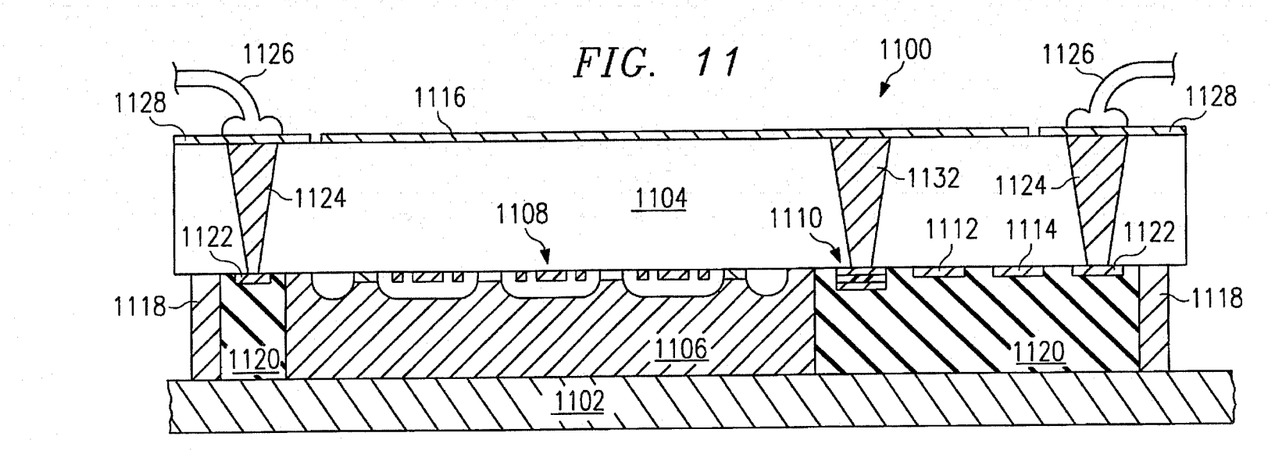
FIG. 11 is a cross-sectional view of a conventional microstrip integrated circuit in a flip-chip implementation in accordance with a sixth preferred embodiment of the invention.

An existing circuit design can easily be adapted to flip-chip implementation. This is important as it is often not cost effective to completely redesign a circuit to incorporate inverted microstrip, for example, when the circuit was originally designed to use conventional microstrip circuitry. It is not necessary that an integrated circuit be designed specifically for flip-chip implementation. A conventional integrated circuit like that shown in FIG. 1 can be adapted for flip-chip implementation. This approach is shown in FIG. 11 as a sixth preferred embodiment. In FIG. 11 a conventional microwave integrated circuit (shown generally at 1100) is flipped and mounted on heatsink 1102. The substrate 1104 on which integrated circuit 1100 is fabricated is supported by a plated common lead in the form of an airbridge 1106, which connects portions of an active device 1108 to the heatsink 1102. The lead 1106 can be connected, for example, to the source of an FET amplifier in common-source configuration, or the emitter of an HBT amplifier in common-emitter configuration. The common lead 1106 is plated to a thickness of approximately 100 to 150 um, or the approximate thickness of substrate 1104. This results in a spacing between the bottom surface of substrate 1104 and the top surface of heatsink 1102 of approximately one substrate thickness. It is important that the circuitry comprising capacitors 1110, resistors 1112, microstrip 1114 and other transmission lines be as far from heatsink 1102 as is practical. As shown in FIG. 9a, microstrip circuits are designed upon the assumption that the microstrip line is separated from a groundplane by dielectric on one side, and is exposed to air or another low-permittivity medium on the other. When a conventional microstrip integrated circuit such as that shown at 1100 is flipped to gain thermal impedance advantages, the line impedances of the microstrip circuits are not as originally designed (note that circuit 1100 also includes a top side groundplane 1116). The proximity of the surface of heatsink 1102 influences the characteristic impedance of line 1114 and can result in interior circuit performance. However, if the top surface of heatsink 1102 is separated from microstrip line 1114 by a distance of approximately one substrate thickness, the characteristic impedance of the line is not substantially changed from that of the ideal configuration shown in FIG. 9a. The substrate 1104 can be further supported by solder bumps 1118 for example. The void 1120 between the bottom surface of substrate 1104 and the top surface of heatsink 1102 can be filled with air or alternatively be filled with a low-permittivity dielectric such as polyimide for additional mechanical stability. As in the first preferred embodiment, heatsink 1102 can be a metal such as gold-plated copper, or a high-thermal-conductivity dielectric material such as AlN or BeO, for example. If a high-thermal-conductivity dielectric is selected, the dielectric can be mounted on a metal ground plane for additional heat transfer.

One difficulty with using a conventional microwave integrated circuit in a "flipped" configuration involves the input and output access to the circuit. In the conventional circuit shown in FIG. 1, input and output signals are routed from pads on the top surface of the substrate 120 by bond wire 112 to pad 114 on external substrate 116. This is not a viable option for the circuit of FIG. 11 since pads 1122 are inaccessible to bonding. A solution to this problem is shown in FIG. 11. Pads 1122 are connected through vias 1124 to the top side of substrate 1104. Wires 1126 may then be bonded to pads or coplanar waveguide formed adjacent the groundplane 1116 on the topside of the substrate 1104.

Figure 12:
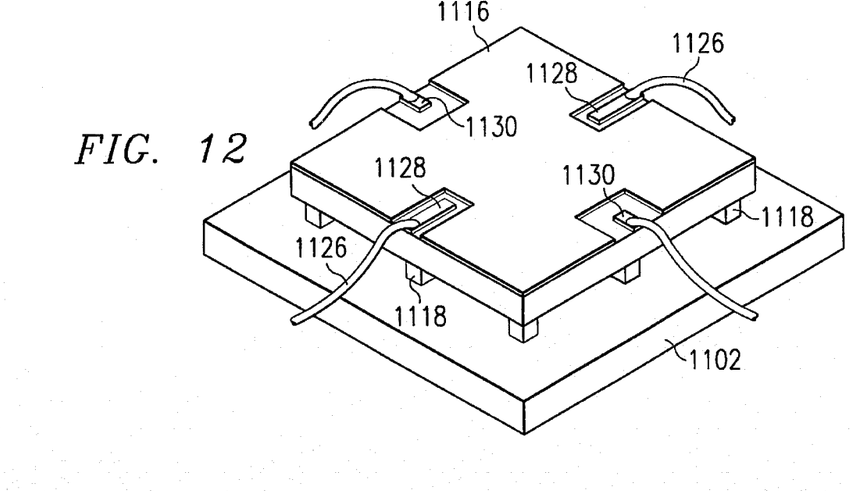
FIG. 12 is a perspective view of the structure shown in FIG. 11.

FIG. 12 is a perspective view of the sixth embodiment circuit of FIG. 11 showing wires 1126 ball-bonded to coplanar waveguide pads 1128. Bias pads 1130 can also be accessed on the top side of the substrate. The spacing between the coplanar pads 1128 and the groundplane 1116 determines the characteristic impedance of the coplanar waveguide. For example, tier a 100 μm GaAs substrate thickness, a 50-ohm coplanar waveguide typically comprises a coplanar pad 1128 having a width of approximately 55 μm and a spacing between the coplanar pad 1128 and groundplane 1116 of approximately 40 μm. Conversely, the spacing between the bias pad 1130 and the groundplane 1116 is not critical. A conventional integrated circuit typically incorporates vias through the substrate such as that shown at 1132 for shunt capacitor 1110. Therefore, the addition of vias 1124 for the transition between microstrip lines on the bottom surface of the substrate to coplanar waveguide on the top surface requires no additional processing. Additional processing is needed to etch the backside metal to form groundplane 1116 and coplanar waveguide 1128 and bias pads 1130. Only one mask layer (for the additional vias 1124) need be modified to adapt a conventional circuit layout for flip-chip implementation. This approach may be the most cost effective for existing designs for which a flip-chip implementation is deemed desirable.

High-density Integrated Circuits

Figure 4:
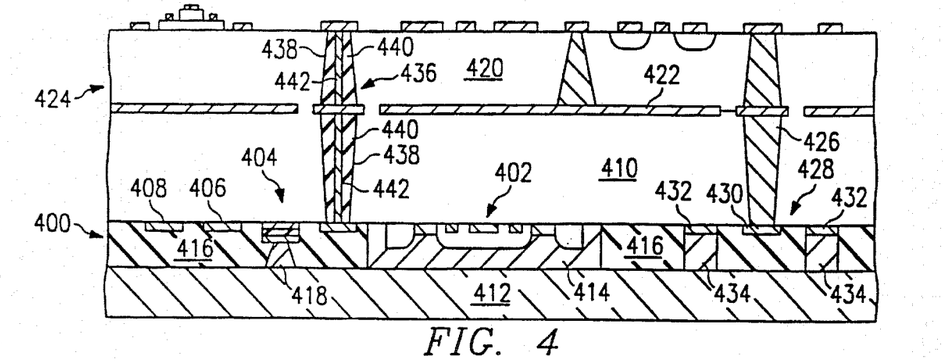
FIG. 4 is a cross-sectional view of a high density integrated circuit having a flip-chip lower circuit with a second circuit bonded on top of the lower circuit in accordance with a second preferred embodiment of the invention.

A second preferred embodiment shown in FIG. 4 includes a "flipped" MMIC 400 similar to that in FIG. 3a, 3b, or 3e with a MESFET 402, capacitor 404, resistor 406, and transmission line 408 fabricated on the bottom side of die 410, which is then mounted on heatsink 412. As in the structure of FIG. 3a, 3b, or 3e, the bottom side is planarized with a combination of airbridges 414 and polyimide 416. Shunt devices, such as capacitor 404 are grounded to heatsink 412 by a via 418 through polyimide 416. Additionally, a second die 420 having a bottom groundplane 422 is bonded to the top surface of die 410. The bonding may be done in a standard manner, e.g. with a thermoplastic, epoxy, or other material that resists delaminating under temperature stresses. An advantage of this embodiment of the invention is that more circuitry can be packed in a given area than with single sided integrated circuits. This configuration is ideal for transmit/receive systems used in telecommunications and radar applications which require both power and low noise integrated circuits in very small packages. Preferably, the flipped circuit 400 is a high power circuit such as a power amplifier to take advantage of the proximity to heatsink 412, while the upper circuit 424 is one of low power dissipation, e.g. a low-noise amplifier, phase shifter, or digital circuitry.

Figure 9C:
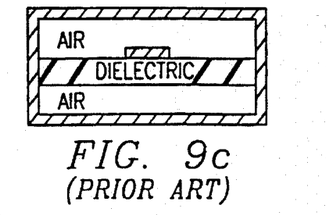

Signals may be passed between the upper and lower circuits through vias 426. Groundplane 422 is discontinuous to allow for this. Since the bottom circuit 400 has a groundplane 422 on top of the die 410 in this configuration, the transmission lines on the bottom side of die 410 are not inverted microstrip. Transmission line 408 is instead a modified "stripline" configuration in which a lead is sandwiched between two different dielectric mediums. A standard stripline configuration is shown in FIG. 9c. In the circuit of FIG. 4, the transmission lines are a modified stripline because the central conductor is bounded on one side by a high-permittivity dielectric, e.g. GaAs, and on the other side by a low-permittivity dielectric, e.g. polyimide. The design of line 408 to achieve a given characteristic impedance may be considerably different from that of inverted microstrip line 302.

Figure 10:
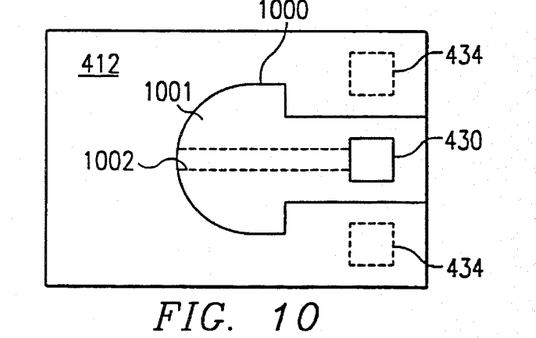
FIG. 10 is a plan view of a coplanar waveguide-to-inverted microstrip transition.

Another feature of the structure of FIG. 4 is coplanar waveguide 428 comprised of a signal conductor 430 and two ground lines 432. It should be noted that this feature may be included in any flip-chip configuration, such as that shown in FIG. 3a, 3b, or 3e, for example. Coplanar waveguide is advantageous during fabrication of the bottom circuit 400. After the formation of the bottom side circuitry it is desirable to have the capability of testing the circuits. Detective circuits may then be culled before the expense of flipping and mounting the die is incurred. However, the circuits of FIG. 3a, 3b, or 3e, and FIG. 4 which utilize inverted microstrip and suspended stripline respectively are very difficult to test prior to flipping the die. This is because the groundplane, i.e. the heatsink 314 and 412, works in conjunction with lines 302 and 408 to form a transmission medium such as inverted microstrip or stripline. Prior to flipping the die, the die lacks a groundplane and thus the lines will not have their designed characteristic impedances. This makes the unflipped circuits virtually impossible to test. However, with coplanar waveguide, the reference or ground for signal line 430 is provided by coplanar groundlines 432. Therefore, the complete transmission medium is located on the die surface and is independent of the heatsink/groundplane. This allows for testing of the circuitry on circuits 300 and 400 prior to flipping. Moreover, the circuits may be "probed" while still in wafer form, i.e. the wafer does not have to be diced before defective circuits are culled. This presents a significant cost advantage over circuits requiring flipping and mounting before testing can be performed. The coplanar waveguide can be functional in the flipped configuration as well by plating the groundlines 432 as is done in forming the airbridge plating 414 to create posts 434 which contact the heatsink 412. A transition from the upper circuit 424 is easily made by etching via 426 through die 410 so that contact is made with the center or signal conductor 430 of the coplanar waveguide 428. FIG. 10 shows a view from beneath groundplane 412. The reference potential, or ground, is provided to groundlines 432 by plated posts 434, which contact groundplane 412. A window 1000 is etched in groundplane 412 to expose polyimide 1001 and to provide a transition between coplanar waveguide and the inverted microstrip or modified stripline transmission lines 1002 that are used in the input/output and matching circuitry of circuit 400.

An alternative to connecting the upper 424 and lower 400 circuits through plated vias as shown in FIG. 4 is to use a coaxial structure 436. Such a structure may be formed by first etching a via hole 438 through dies 420 and 410, filling the vias 438 with a dielectric 440 such as polyimide, etching a hole through the polyimide, and then forming a center conductor 442 by depositing metallization in the hole through the polyimide. A coaxial conductor can potentially have superior loss characteristics as compared to a simple plated via.

Higher density integrated circuits

Figure 5:
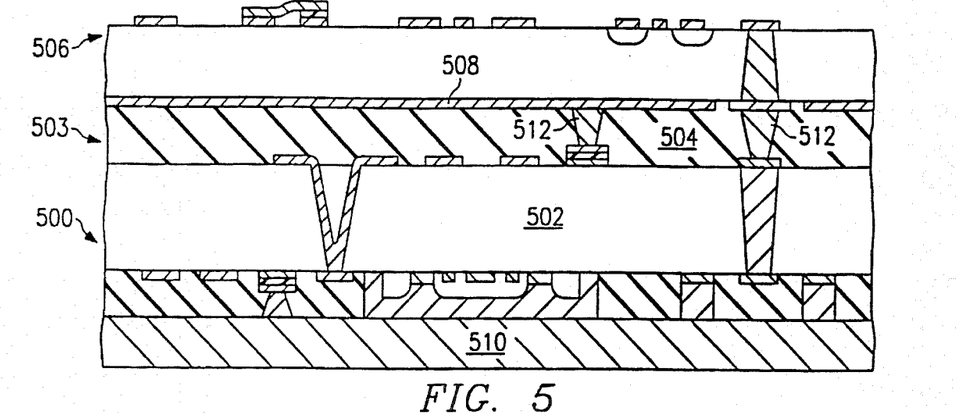
FIG. 5 is a cross-sectional view of a high density integrated circuit having a flip-chip lower circuit with passive circuitry on its top side and with a second integrated circuit bonded on top of said passive circuitry in accordance with a third preferred embodiment of the invention.

A third preferred embodiment of the invention is shown in FIG. 5. It comprises a lower flip-chip integrated circuit 500 fabricated on a die 502 with matching circuitry and other passive components 503 on the die's top side. The top side is planarized with dielectric 504 and a metal groundplane 508 is evaporated and patterned over dielectric 504. An upper integrated circuit 506 may then be bonded to the planarized surface as in the structure of FIG. 4. This approach takes advantage of the fact that the circuit 500 on the bottom side of die 502 does not depend on a particular die thickness for its functionality. Since the die top side can be as far away as 625 μm or more from the bottom side circuitry, a variety of passive devices, switching, and matching circuity 503 can be formed on the top side of die 502. This circuitry can also utilize inverted microstrip because of its proximity to the groundplane 508. Thus, die 502 can have a power circuit 500 on the bottom side to take advantage of the heatsink 510, and passive circuitry on the die top side. This is in addition to the feature of having a low power dissipating circuit 506 bonded to the planarized surface of circuitry 503. As for the lower circuit 500, contact to the groundplane may be in the form of vias 512 through the polyimide planarizing layer 504.

It may be appreciated that the circuitry 503 on the top side of die 502 is not limited to passive and matching circuitry. Prior to the fabrication of any circuitry, epitaxial layers may be grown by a method such as molecular beam epitaxy or metal-organic chemical vapor deposition on both the bottom and top sides of the wafer of which die 502 is a constituent. Epitaxy is traditionally performed on only a single surface of a wafer. However, wafers with epitaxy on both sides allows the formation of active devices on both the top and bottom surfaces, thereby further increasing the packing density of the circuitry.

Flip-chip Configuration for Three-dimensional Components

Figure 6:
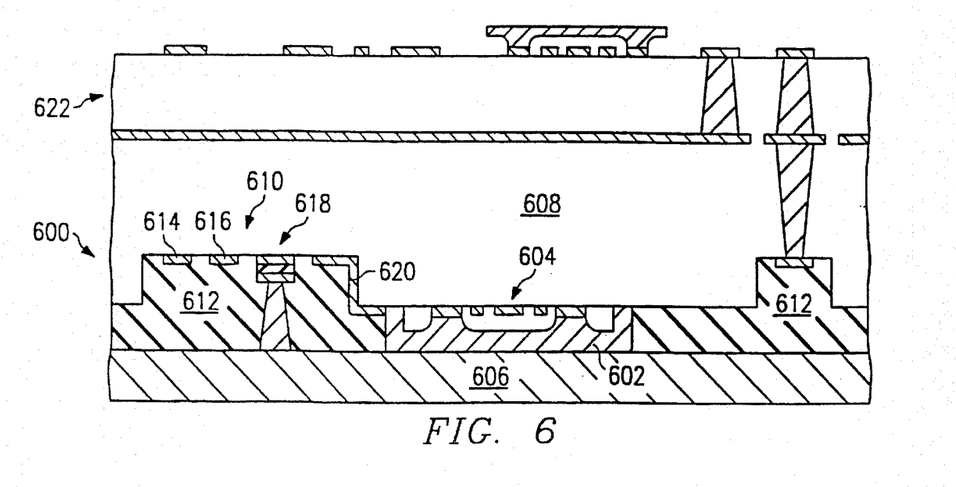
FIG. 6 is a cross-sectional view of a flip-chip device having a recess on its lower surface to accommodate three-dimensional components in accordance with a fourth preferred embodiment of the invention.

A fourth embodiment of the invention shown in FIG. 6 is MMIC 600 circuit having clearance on the bottom surface for three dimensional components such as non-planar inductors. As in the embodiments described above, the airbridge 602 linking the source pads for example of MESFET 604 is in direct contact with heatsink 606. However, in this embodiment a recess is etched in the bottom surface of die 608 in order to form a "tub" 610 approximately 25 to 50 μm in depth or more. This provides space on the bottom surface of die 608 for components that are too large for the planarization approach of the first three embodiments to accommodate. Relatively low-frequency (e.g. L-band) amplifier circuits used in telecommunications applications often require inductance values that are difficult to realize with planar components. The tub 610 of the structure shown in FIG. 6 can be adapted to accommodate a three-dimensional spiral-wound inductor for example. As in the aforementioned embodiments to the invention, the surface which abuts heatsink 606 is planarized with a dielectric 612 such as polyimide. The passive circuitry and components such as inverted microstrip or suspended substrate lines 614, resistors 616, or capacitors 618 can be connected to the active component 604 by metallization 620 which conforms to the step change in the bottom surface of die 608. As in the embodiments described above, a second integrated circuit 622 may be bonded to the top surface of die 608.

Antenna Elements with Improved Thermal Impedance

Figure 7:
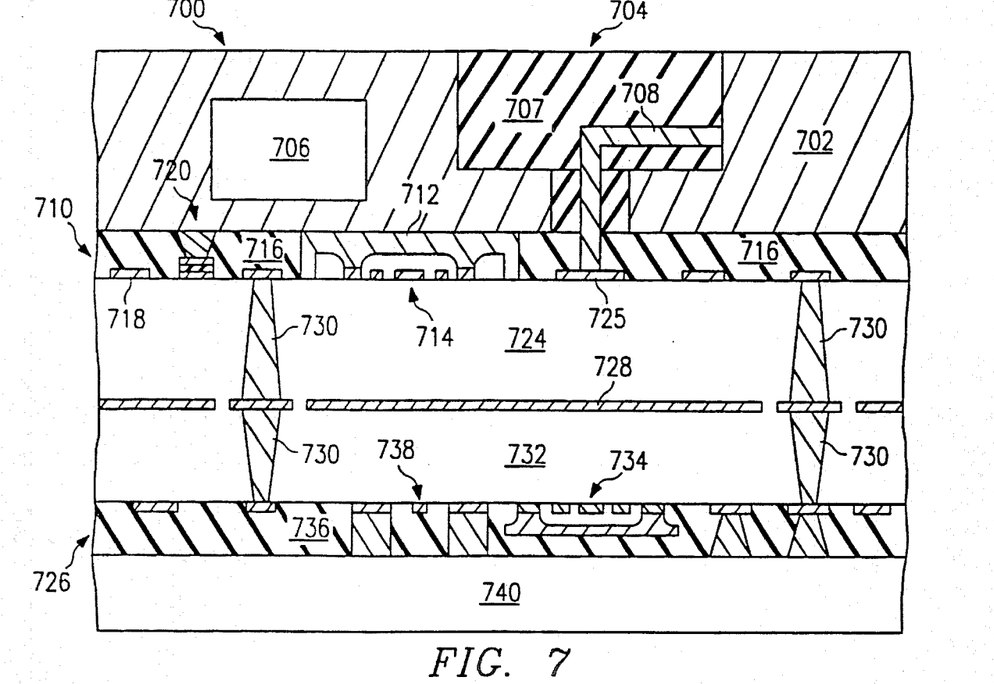
FIG. 7 is a cross-sectional view of an active element for an electronically-beam-steerable antenna in accordance with a fifth preferred embodiment of the invention.

A fifth preferred embodiment of the invention shown in FIG. 7 is an element 700 in an array of elements forming an active array antenna. The element comprises a metal base plate 702 into which an antenna element 704 and cooling duct 706 are mounted. The antenna element shown in this embodiment is a dielectrically-loaded type which is fed by wire 708. The dielectric 707 which loads the antenna element can be any of a variety of low-loss, low-permittivity materials such as quartz, polyimide, Teflon, etc. The baseplate 702 also functions as a heatsink for high-power-dissipating circuit 710, which may be for example a power amplifier. Airbridge 712 connects source pads of MESFET 714. It may be appreciated that though only a two-gate-finger MESFET is shown, the techniques of this embodiment may be applied to much larger transistors with more gate fingers. Airbridge 712 is in contact with baseplate 702, which acts as a heatsink for the MESFET. It may also be appreciated that other type of active devices such as HBTs, HEMTs, HFETs, etc. may also benefit from this configuration. The top surface of circuit 710 is planarized by depositing dielectric 716 to cover the non-plated regions of the circuit, i.e. areas other than airbridges and ground contacts. Resistors 718, capacitors 720, and transmission lines in the form of stripline 722 may be formed on the surface of die 724. The output of the high-power circuit is taken from pad 725 on the surface of the semiconductor die to antenna feed wire 708. An advantage of using the flip-chip approach with top-side matching circuitry and transmission lines is that the line length from the amplifier output 725 to the antenna is minimal. This is important in ensuring that the highest power output possible is provided to the antenna element. Active arrays typically have long feed lines between the power amplifier and the antenna element. Such arrays are comparatively inefficient because of the losses involved in transmitting the signal from the amplifier to the antenna.

A second circuit may be mounted on the bottom side of die 724. In FIG. 7 a phase shifter circuit 726 is shown. The phase shifter integrated circuit is shown with a groundplane 728 and is bonded directly to die 724 with an adhesive such as thermoplastic or epoxy. Connections between the power amplifier 710 and the phase shifter circuit 726 are in the form of plated vias 730 through dies 724 and 732. The phase shifter 726 may comprise MESFETs 734 as shown, PIN diodes, transmission lines, resistors, and capacitors, etc. As in the power amplifier circuit 710, the surface of circuit 726 is planarized with a low-permittivity, low-loss dielectric 736 such as polyimide or a like material. Transmission lines may be in the form of coplanar waveguide 738 having a central signal line between ground lines or as suspended stripline or inverted microstrip.

Figure 8:
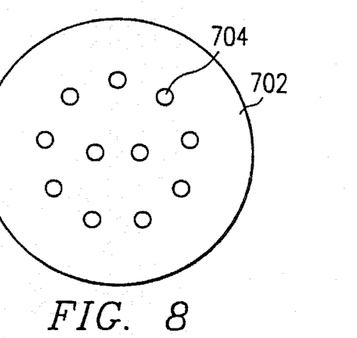
FIG. 8 is a front view of an antenna showing a base plate and active elements in accordance with a fifth preferred embodiment of the invention.

In this embodiment a DC/RF/Control logic distribution printed circuit board 740 is mounted on the planarized surface of phase shifter circuit 726. Such a board can take logic inputs from an antenna control computer, or low amplitude RF signals from pre-amplifier circuitry. The board's function could be to provide phase selection information to the phase shifter such that the signal from the antenna element 704 works in conjunction with other elements mounted in baseplate 702 (see FIG. 8) to produce an electronically steerable antenna beam. The system described in this embodiment might find application in a variety of applications, from microwave distribution networks to radars.

A few preferred embodiments have been described in detail hereinabove. It is to be understood that the scope of the invention also comprehends embodiments different from those described, yet within the scope of the claims.

Internal and external connections can be ohmic, capacitive, inductive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, though GaAs was used as the wafer or die material in the above embodiments, it may be appreciated that other semiconductor materials may be used. Also, though only polyimide was used as a dielectric, it may be appreciated that other dielectrics having low-permittivity and low-loss may be used. It is therefore intended that the appended claims encompass any such modifications or embodiments.

What is claimed is:

1. An integrated circuit, comprising:

(a) at least one transistor formed at a frontside surface of a substrate;

(b) at least one transmission line at said frontside surface;

(c) an airbridge formed over portions of said at least one transistor wherein a top surface of said airbridge is spaced from said frontside surface by a distance approximately equal to, or greater than, the thickness of said substrate;

(d) a heatsink coupled to said airbridge; and (e) a conducting via through said substrate coupling said at least one transistor to a bond pad at a backside surface.

2. The circuit of claim 1, further comprising a groundplane at said backside surface of said substrate.

3. The circuit of claim 1, wherein said heatsink comprises a dielectric.

4. The circuit of claim 3, wherein said dielectric is taken from a group consisting of AlN and BeO.

5. The circuit of claim 1, wherein said heatsink is metal.

6. The circuit of claim 5, wherein said metal is plated with gold.

7. The circuit of claim 6, wherein said metal is copper.

8. The circuit of claim 1, wherein said bondpad at said backside surface of said substrate is a conductive element in a coplanar waveguide.

9. The circuit of claim 3, wherein said dielectric heatsink is coupled to a metal heatsink.

10. An integrated circuit, comprising:

(a) at least one transistor formed at a frontside surface of a substrate;

(b) at least one transmission line at said frontside surface;

(c) an airbridge formed over portions of said at least one transistor wherein a top surface of said airbridge is spaced from said frontside surface by a distance approximately equal to, or greater than, the thickness of said substrate;

(d) dielectric covering said at least one transmission line such that a surface of said dielectric is substantially planar with said top surface of said airbridge;

(e) a heatsink coupled to said airbridge; and (f) a conducting via through said substrate coupling said at least one transistor to a bond pad at said backside surface.

11. The circuit of claim 10, wherein said dielectric is polyimide.

12. The circuit of claim 10, wherein said heatsink is a dielectric.

13. The circuit of claim 12, wherein said dielectric is taken from a group consisting of AlN and BeO.

* * * * *